(12) United States Patent
Fournel et al.

(10) Patent No.: US 9,076,841 B2
(45) Date of Patent: Jul. 7, 2015

(54) DOUBLE LAYER TRANSFER METHOD (71) Applicant: COMMISSARIAT A L'ENERGIE ATOMIQUE ET AUX ENERGIES ALTERNATIVES, Paris (FR)

(72) Inventors: Frank Fournel, Villard-Bonnot (FR); Maxime Argoud, Lyons (FR); Jeremy Da Fonseca, Teche (FR); Hubert Moriceau, Saint-Egreve (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 0 days.

(21) Appl. No.: 14/349,784

(22) PCT Filed: Sep. 20, 2012

(86) PCT No.: PCT/FR2012/052100
§ 371 (c)(1),
(2) Date: Apr. 4, 2014

(87) PCT Pub. No.: WO2013/050683
PCT Pub. Date: Apr. 11, 2013

(65) Prior Publication Data
US 2014/0295642 A1 Oct. 2, 2014

(30) Foreign Application Priority Data
Oct. 4, 2011 (FR) .................................. 11 58944

(51) Int. Cl.
H01L 21/44 (2006.01)
H01L 21/48 (2006.01)
H01L 21/50 (2006.01)
(Continued)

(52) U.S. Cl.
CPC ........ *H01L 21/76259* (2013.01); *H01L 21/187* (2013.01); *H01L 21/2007* (2013.01); *H01L 31/1892* (2013.01); *Y02E 10/50* (2013.01); *H01L 29/0603* (2013.01)

(58) Field of Classification Search
CPC .................. H01L 21/02216; H01L 21/02126; H01L 21/02332; H01L 21/3212; H01L 21/28556; H01L 21/6704; H01L 21/14694; H01L 31/03044
USPC ......... 438/106, 104, 107, 113, 118, 311, 475, 438/509, 477, 487, 602, 603, 604, 679, 680, 438/692, 729, 776, 779, 780, 786; 257/E21.006, E21.007, E21.077, 257/E21.084, E21.127, E21.126, E21.128, 257/E21.217, E21.229, E21.267, E21.304, 257/E21.32, E21.449, E21.475, E21.499
See application file for complete search history.

(56) References Cited

U.S. PATENT DOCUMENTS

7,960,248 B2 * 6/2011 Di Cioccio .................... 438/459
8,076,215 B2 * 12/2011 Mathew et al. ............... 438/458
(Continued)

*Primary Examiner* — David Nhu
(74) *Attorney, Agent, or Firm* — Cantor Colburn LLP (57) ABSTRACT A method of transferring a layer including: a) providing a layer joined to an initial substrate with a binding energy E0; b) bonding a front face of the layer on an intermediate substrate according to an intermediate bonding energy Ei; c) detaching the initial substrate from the layer; e) bonding a rear face onto a final substrate according to a final bonding energy Ef; and f) debonding the intermediate substrate from the layer to transfer the layer onto the final substrate; step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef.

17 Claims, 4 Drawing Sheets

(51) Int. Cl.
*H01L 21/762* (2006.01)
*H01L 21/18* (2006.01)
*H01L 21/20* (2006.01)
*H01L 31/18* (2006.01)
*H01L 29/06* (2006.01)

(56) References Cited

U.S. PATENT DOCUMENTS 8,263,478 B2 * 9/2012 Akiyama et al. .............. 438/458
8,871,640 B2 * 10/2014 Yonehara et al. ............. 438/667

* cited by examiner

DOUBLE LAYER TRANSFER METHOD

RELATED APPLICATIONS

This application is a 35 U.S.C. §371 filing of PCT/FR2012/052100, filed on Sep. 20, 2012, which claims the benefit of French Patent Application No. 1158944, filed on Oct. 4, 2011, the contents of which are herein incorporated by reference in their entirety.

TECHNICAL FIELD

The present invention relates to a method of transfer of a layer composed, in particular, of a semi-conductor, insulating or metallic material. The invention also relates to an intermediate structure and a final structure comprising a transferred layer, for example, by the layer transfer method. This method and these structures may particularly be applied in the field of flexible technologies, electronics, for example flexible electronics such as smart cards, smart textiles, MEMS (micro electro mechanical systems), NEMS (nano electro mechanical systems), high power electronics, RF and microwave, microelectronics, optics, optoelectronics and photovoltaics.

BACKGROUND

For the development of innovative substrates, it is very often interesting to be able to transfer a layer of an initial substrate onto an intermediate substrate in order to undertake technological steps that are not compatible with the initial substrate. Moreover, the transfer onto an intermediate substrate makes it possible to access a rear face of the layer which is not exposed when the layer is bonded on an initial substrate. Then, it is often necessary to proceed with a second transfer of said layer from the intermediate substrate onto a final substrate suitable for the final application. To minimize production costs, these transfers must be achieved without loss of the initial and intermediate substrates in order to be able to reuse the latter. To this end, the transfer must be performed by debonding the layer from one substrate and transferring it the other. However, in order to achieve two such transfers, the bonding energies must be judiciously selected. Indeed, the transfer of the initial substrate onto the intermediate substrate requires that the bonding energy of the layer onto the intermediate substrate, Ei, be higher than the bonding energy of the layer onto its initial support, E0. Similarly, the second transfer requires that the energy of the final bonding between the layer and the final substrate, Ef, be stronger than the bonding energy between the layer and the intermediate substrate, Ei. These conditions can be presented in the form of inequalities E0<Ei<Ef.

Yet, the order of the binding energies of these different bondings highly restricts the number of possible technologies for implementing the bonding of the layer on the different substrates and the selective debonding of the layer from these same substrates. Particularly, it seems impossible to use the same method for the bonding of the layer onto the initial substrate (first step) and for the bonding of the layer and the final substrate (last step). Indeed, if the same method or type of bonding is implemented in the first and last steps, which can be likened to bondings having a similar bonding energy, it does not seem possible to find an intermediate bonding with a binding energy stronger than the first bonding and at the same time lower than the last bonding.

BRIEF SUMMARY

One of the purposes of the invention is to overcome this drawback, while ensuring a cost effective method and allowing the implementation of technological steps on the rear face of the layer.

To this end, and according to a first aspect, the invention relates to a method for transferring a layer composed, in particular, of a semi-conductor, insulating or metallic material, the method comprising the steps of:

a) providing a layer joined to an initial substrate with a binding energy E0 between the layer and the initial substrate;

b) bonding a front face of the layer on an intermediate substrate according to an intermediate bonding energy Ei;

c) detaching the initial substrate from the layer to expose the rear face of the layer;

e) bonding a rear face onto a final substrate according to a final bonding energy Ef; and f) debonding the intermediate substrate from the layer for the transfer of the layer onto the final substrate;

step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef.

In the present application, the term 'layer' means a layer to be transferred which may have various thicknesses. It may comprise a thin layer, the thickness of which is such that the layer is very flexible. The thin layer is thus difficult to be handled and gets easily wound around itself. The method according to the invention advantageously applies to this type of layer given that at each step, the thin layer is joined to a stiffening substrate or a support, which gives it a mechanical rigidity. It is thus possible to carry out technological steps, particularly etching or material deposition on the layer joined to a substrate. The thickness of a thin layer is determined by the intrinsic physical properties of the material concerned. The thickness of a thin silicon layer may range between several tens of nanometers and around 150 micrometers, for example.

The layer to be transferred may also comprise a self-supporting layer, namely a layer, the thickness of which is such that the layer has sufficient rigidity to be easily handled. The layer may also comprise a substrate or a wafer of a thickness of several hundred micrometers.

As is standard, the 'front face' of the layer means the free face or exposed face of the layer when it is joined to the initial substrate. Conversely, the "rear face" is the face of the layer which is opposite to the front face.

Moreover, the binding energy of step a) of the method may comprise a bonding energy or an energy for holding the layer on the initial substrate.

Thus, the method according to the invention implements a double layer transfer such that technological steps may be carried out on the exposed or free rear face of the layer when the front face is bonded onto an intermediate substrate. Furthermore, during the double layer transfer, it is frequent to implement the steps of etching the substrate to be removed, leading to the loss of the substrate. The method according to the invention advantageously makes it possible to selectively detach or peel off (debond) the substrates to be removed such that it becomes possible to recycle them for reuse in the method.

The siloxane bonds Si—O—Si implemented in step b) of the method according to the invention are covalent bonds. These Si—O—Si bonds thus ensure a high intermediate bonding energy Ei between the layer and the intermediate substrate. Furthermore, these siloxane bonds Si—O—Si are sensitive to the presence of humidity. it is thus possible to modulate the bonding energy Ei by modifying the water content of the medium in which these siloxane bonds are placed. Thus, when the first atmosphere of the step c) according to the invention is anhydrous, the siloxane bonds provide a bonding energy Ei1 greater than the bonding energy Ei2 obtained in the second wet atmosphere of step f) according to the invention.

Furthermore, this method makes it possible to avoid the requirements of the known double layer transfer methods. In these methods, it is in fact necessary that the bonding energy E0 be lower than the value of the energy Ef such that the intermediate bonding energy Ei ranges between the energies E0 and Ef. This implies that the types of bonding between the layer and the initial substrate and between the layer and the final substrate be different. However, the method of the present invention advantageously enables an intermediate bonding of a variable energy Ei, such that Ei can be higher than E0 during detachment of the initial substrate, and may also be lower than Ef during debonding of the intermediate substrate. It is thus possible to apply an identical type of bonding to the layer on the initial substrate and on the final substrate and to use an energy E0 similar to the energy Ef.

It goes without saying that the method according to the invention also makes it possible to use a bonding between the layer and the initial substrate that is different from the bonding between the layer and the final substrate. It is thus possible according to the method of the invention that bonding energy E0 is different from bonding energy Ef and energy Ei2 is higher than or equal to energy Ei1.

According to one embodiment, step b) of the method includes a step of implementing a direct hydrophilic bonding. What is meant by 'direct bonding' of the layer with the intermediate substrate is that the bonding is based on a molecular adhesion of the surfaces brought into direct contact, that is to say, without adding glue to the interface, nor adhesive, wax, or low melting temperature metal. In this case, the attractive forces between the two surfaces, particularly Van der Waals forces, are high enough to cause the molecular adhesion. Also, this direct molecular bonding is 'hydrophilic' in that it comprises the fact of contacting two hydrophilic surfaces with a water molecules holding capacity. These bonds involve interactions by the formation of hydrogen bonds between the two surfaces. These bonds provide one of the strongest interactions of the Van der Waals bonds. This direct hydrophilic bonding mode thus ensures a strong bonding energy between the layer and the intermediate substrate at room temperature.

Preferably, the direct hydrophilic bonding of step b) is followed by a step of bonding stabilization annealing. This annealing comprises applying a thermal treatment between a few minutes to a few hours such as to promote the formation of hydrogen bonds and covalent bonds between the two surfaces. Thereby, an intimate bonding having a greater bonding energy than that provided by simply placing in direct contact the hydrophilic surfaces is obtained.

According to an alternative embodiment, step b) of the method includes a step of implementing an anodic bonding. What is meant by "anodic bonding" is a direct bonding as described above, comprising contacting a silicon layer and a silicon oxide layer or two silicon oxide layers, a high temperature thermal treatment and a high electrical potential difference between the layers and/or substrates to be bonded. The thermal treatment temperature is typically around 400° C. and the applied electrical potential difference is typically in the magnitude of several hundred volts.

According to one embodiment, the method comprises, prior to step b), a step of chemical mechanical polishing and/or a step of cleaning the front face of the layer and the surface of the intermediate substrate. The chemical mechanical polishing, also known by the skilled person as CMP, has the effect of reducing the roughness of the surfaces to be bonded such as to improve the approximation of the surfaces in order to increase the interactions and initiate the bond formation. The polishing is applied until a roughness of less than about 5 angstroms RMS (Root Mean Square) is obtained on a field of 5 micrometers×5 micrometers. Furthermore, the cleaning has the effect of removing the single particles on the surfaces, which may be detrimental to a good bonding. The cleaning also enables to make the surfaces hydrophilic before they are put in contact. Hence, these steps make it possible to achieve a good direct hydrophilic bonding.

According to one embodiment, the method comprises a step of forming a silicon layer or an oxide layer selected among the native $SiO_2$, thermal $SiO_2$, deposited $SiO_2$, $SiOx$ and $Si_xO_yN_z$ respectively on the front face of the layer and on the intermediate substrate. Step b) of the method also comprises a step of contacting the formed layers with each other such as to obtain the formation of siloxane bonds Si—O—Si. The x value of the non-stoichiometric silicon oxide SiOx is different from zero. Similarly, the values of x, y and z of the silicon oxynitride $Si_xO_yN_z$ are different from zero. The silicon layer will oxidize in the air to form a layer of native oxide such as to enable the formation of Si—O—Si bonds. Hence, these layers make it possible to form covalent bonds between the layer and the intermediate substrate and to obtain a high intermediate bonding energy Ei.

The native oxide is an oxide which naturally forms in the presence of air at the surface of a silicon material. The thickness of such an oxide layer is naturally restricted to around 10 to 15 angstroms. The thermal silicon oxide may be obtained by thermal oxidation of silicon in a wet atmosphere. The oxide may also be prepared by dry or wet chemistry. The deposited oxide $SiO_2$, the oxide SiOx and oxynitride $SiO_xN_y$ are commonly obtained by deposition using various known techniques such as by CVD (Chemical Vapor Deposition) and by PVD (Physical Vapor Deposition) etc. The oxide can also be produced with a plasma technology such as RIE (Reactive Ion Etch) etching, ICP (Inductive Coupled Plasma) or ECR (Electron Cyclotron Resonance). These oxide development technologies can be used alone or in combination. It is furthermore understood that the oxide may comprise doping elements without departing from the scope of the invention. In the present application, a thermal treatment can be applied to the deposited oxides in order to make them denser and modify their bonding properties.

According to one aspect of the invention, the first anhydrous atmosphere of the method has a water vapor content of less than 1 ppm. In the present application, the term 'anhydrous atmosphere' defines an atmosphere comprising less humidity than an atmosphere defined by the expression 'wet atmosphere' used below. This anhydrous atmosphere is beneficial to the detachment between the layer and the initial substrate. Indeed, the absence of humidity makes it possible to obtain a high bonding energy Ei1 between the layer and the intermediate substrate so that the energy Ei1 is higher than the binding energy E0 between the layer and the initial substrate.

Preferentially, the anhydrous atmosphere is a dry nitrogen atmosphere. The use of this atmosphere is advantageous in that it is simple to implement and provides a neutral environment for the materials used.

According to another aspect of the invention, the second wet atmosphere of the method has a humidity content ranging between 20% and 80%. Indeed, the presence of humidity promotes a proportional weakening of the bonding energy between the thin layer and the intermediate substrate. It is thus possible to make the value of the energy Ei2 vary by choosing an appropriate humidity rate.

Preferably, the second atmosphere comprises a humidity rate of around 40%. Indeed, the atmosphere of clean rooms typically has a humidity rate of 40%. Hence, it is not necessary to provide a specific enclosure, the atmosphere humidity rate of which would be adjusted differently from that of the clean room for performing the debonding.

Advantageously, the detachment of step c) and/or the debonding of step f) comprise the simultaneous application of mechanical stress, such as through the use of jaws, the application of a blade or a wedge respectively between the layer and the initial substrate and between the intermediate substrate and the layer. Indeed, the mechanical stress makes it possible to weaken the binding energy E0 in step c) and the bonding energy Ei2 in step f). The jaws make it particularly possible to separate the layer from the substrates at the weakest interface using a suction mechanism.

According to an alternative embodiment, the detachment of step c) comprises the application of a pressurized jet of dry air or nitrogen, or a laser irradiation.

According to another alternative embodiment, the debonding of step f) is obtained by pressurized jets of humid air or water.

Another optional feature of this method comprises a technological step d) which is performed between steps c) and e), and which is applied to the rear face of the layer, the thermal budget of the technological step having a value lower than a threshold value beyond which Ei2>Ef. By thermal budget is meant the application of a thermal treatment over a given period of time. Indeed, the application of a thermal budget can initiate the formation of new siloxane bonds that further reinforce the intermediate bonding energy Ei2 between the layer and the intermediate substrate. Monitoring of the thermal budget thus make it possible to ensure that the intermediate bonding energy Ei2 remains lower than the final bonding energy Ef. This technological step d) thus makes it possible to functionalize the rear face of the mechanically rigidified layer by the bonding with the intermediate substrate while limiting the intermediate bonding energy Ei2 for the transfer of the layer onto the final substrate.

According to one embodiment, the technological step d) comprises the ion etching and/or chemical etching and/or the photolithography and/or deposition of at least one layer of material, particularly selected from among semi-conductor materials. The layer deposition can be achieved by epitaxy and may include the formation of one or more buffer layers to adjust the parameter of the lattice constant of the layer material serving thus as a seed to that of the material of the epitaxied layer.

Preferably, step e) of the method comprises a bonding step carried out via an adhesive film such as a DiVinylSiloxane-bis-BenzoCycloButene (DVS-bis-BCB), polyimide or a photosensitive polymer film. The use of an adhesive film makes it possible to obtain a bonding that is simple to implement particularly in that it is not necessary to planarize and clean the surfaces with a lot of precision.

According to an alternative embodiment, step e) of the method includes a step of molecular adhesion bonding such that the final bonding energy has a value Ef independent from the humidity rate of the second atmosphere. This bonding may particularly be implemented by depositing a layer of silicon nitride $Si_xN_y$ or $SiN_x$: H on the rear face of the layer and/or on the final substrate. The values of x and y are respectively different from zero, the nitride able to be $Si_3N_4$, for example. This bonding may also be implemented by a direct hydrophobic bonding. A bonding by molecular adhesion is advantageous in that it can lead to a high bonding energy.

According to another embodiment, the binding energy E0 between the layer and the initial substrate is obtained by forming a porous layer on which the layer is deposited. The porous layer is obtained for example by the Eltran method, a descriptive example of which can be found in T. Yonehara, K. Sakagushi and N. Sato, Appl. Phys. Lett. vol. 64 (16) pp.2108-2110 (1994). The porous layer is advantageous in that it has low holding energy E0, which promotes the breaking of the bond between the layer and the initial substrate during step c) of the method. Furthermore, the fact of depositing the layer on the top face of the porous layer makes it possible to access layers of significant thicknesses, difficult to reach by other forming methods. Preferably, the layer is deposited by epitaxy on the porous layer in order to form a monocrystalline layer.

According to yet another embodiment, the layer is obtained by implanting ionic species through the front face of a substrate such as to obtain a weakening plane on either face of the layer and of an initial substrate. The binding energy E0 between the layer and the initial substrate at the weakening plane is sufficiently low to facilitate the transfer of the layer onto the intermediate substrate. In this regard, the Smart Cut™ technique can be used, a description of which for example can be found in Silicon-On-Insulator Technology: Materials to VLSI, 2nd Edition by Jean-Pierre Colinge (Kluwer Academic Publishers, p.50 and 51).

In the two aforementioned embodiments of step a) of the method according to the invention and when step e) of the method according to the invention comprises a step of molecular adhesion bonding, it is obvious that the binding energy E0 is lower than the bonding energy Ef. It is thus possible that the energy Ei2 is higher than the energy Ei1.

Preferably, the layer comprises a monocrystalline silicon material and the intermediate substrate comprises a silicon material. The material of the intermediate substrate in monocrystalline or polycrystalline silicon makes it possible to ensure a high resistance to temperature and corrosive environments in order to enable the application of many types of technological steps on the layer.

Alternatively, the layer comprises a material selected from among a material composed of silicon and germanium, a material of elements from the group II-VI and a binary, ternary or quaternary material of elements from the group III-V. The materials III-V are particularly advantageous for applications in photovoltaics and optoelectronics, particularly to manufacture lasers and diodes. Furthermore, when the constituting material has a polar crystal structure, as may be the case for materials comprising elements III-N such as GaN, the layer may then present two faces of different polarity leading to different properties. It is thus particularly interesting to be able to access and functionalize the rear face of the layer which has properties that are different from the front face.

The initial substrate material and the final substrate material comprise a material selected from among sapphire, silicon, germanium, silica, glass, quartz, a material of elements from the group II-VI, a binary, ternary or quaternary material of elements from the group III-V such as AsGa, InP or GaN, a metal, a metal alloy and a polymer, for example a polyimide such as Kapton®. A material selected from among polymers has the advantage of being easily bonded via an adhesive film. The polymer may also be debonded from the thin layer by more techniques, particularly by applying mechanical stress associated with a peel stress. Moreover, the flexibility of polymer substrates may be judiciously used for applications in the fields of flexible technologies, flexible electronics such as smart cards, smart textiles and particularly for the manufacturing of strain gauges.

According to a second aspect, the invention relates to an intermediate structure formed of a stack comprising
a final substrate in a polymer material,
a DiVinylSiloxane-bis-BenzoCycloButene (DVS-bis-BCB)-based adhesive film,
a monocrystalline silicon layer, and
a silicon intermediate substrate bonded to a front face of the layer by siloxane bonds Si—O—Si.

Thus, with such a structure it is possible to facilitate the debonding of the layer from the intermediate substrate for a transfer onto a final substrate by making the humidity rate present in the atmosphere vary.

In particular, the final bonding energy Ef between a rear face of the layer and the final substrate of the intermediate structure is higher than the intermediate bonding energy Ei2 between the front face of the layer and the intermediate substrate in an atmosphere having a humidity content ranging between 20 and 80%. Under these conditions, it is thus possible to debond the layer from the intermediate substrate.

Advantageously, the rear face of the layer exhibits features for applications in the field of flexible technologies and flexible electronics.

According to a third aspect, the invention relates to a final structure, comprising
a final substrate in a polymer material,
a DVS-bis-BCB-based adhesive film, and
a monocrystalline silicon layer,
the rear face of the layer exhibiting features for applications in the field of flexible technologies, flexible electronics such as smart cards, smart textiles, electronics, MEMS, NEMS, high power electronics, RF and microwave, microelectronics, optics, optoelectronics and photovoltaics.

The layer thus functionalized may serve as an active layer in a device of the aforementioned fields. In addition, the front face of the layer being free and exposed, it is also possible to carry out technological steps on this surface.

BRIEF DESCRIPTION OF THE DRAWINGS

Other aspects, aims and advantages of the present invention will become more apparent upon reading the following description of two embodiments thereof, given by way of non-limiting examples and made with reference to the accompanying drawings. The figures do not necessarily comply with the scale of all the represented elements in order to improve readability. Dotted lines are used in the figures in order to illustrate distinctly and clearly a layer of material which, despite the dots, is in a continuous form. In the rest of the description, for the sake of simplicity, elements that are identical, similar or equivalent to the different embodiments bear the same numerical references.

DETAILED DESCRIPTION

Figure 1A:
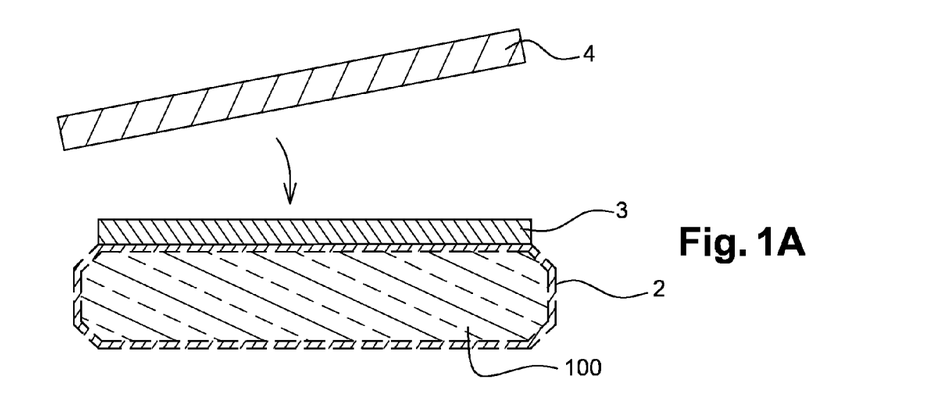
FIGS. 1A to 1J represent steps of a method of transferring a layer according to a first embodiment of the invention.

With reference to FIG. 1A, the method is implemented based on a silicon donor substrate 100 with a thickness of around 725 micrometers from which the layer 1 to be transferred will be prepared. Such a substrate 100 typically has fallen edges at the periphery of its surface that are made according to the SEMI standards. These fallen edges facilitate the handling of the substrate which would otherwise flake away and create particles at the surface, liable to hinder a subsequent bonding. A native oxide layer 2 is formed on the surface of the substrate 100 when in contact with air. An adhesive film 3 made of DVS-bis-BCB polymer is deposited on the silicon substrate 100, with a thickness of 10 micrometers by centrifugal coating or spin coating, a method well known by the skilled person. The DVS-bis-BCB film 3 is then cross-linked by applying a thermal treatment at 250° C. for 1 hour. A polymer substrate 4, for example a polyimide such as "Kapton®", having a thickness higher than 50 micrometers, is then bonded by thermo-compression at a temperature of 250° C. on the silicon donor substrate 100 via the film 3 of cross-linked DVS-bis-BCB.

Figure 1B:
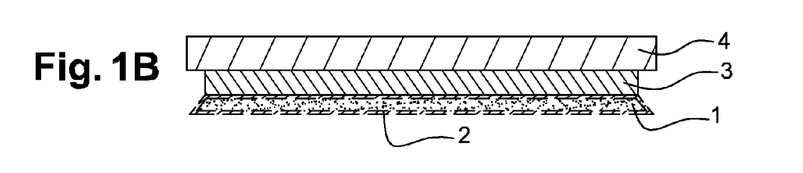

With reference to FIG. 1B, the silicon substrate 100 is then thinned until obtaining a layer 1 to be transferred of a thickness of about 50 micrometers, for example by grinding, chemical planning down and chemical mechanical polishing CMP. The bonding of the silicon layer 1 bonded with the initial polyimide substrate 4 has an average binding energy E0 of around $2J/m^2$. A native oxide layer 2 is naturally formed at the surface of the silicon layer 1 in contact with the air.

Figure 1C:
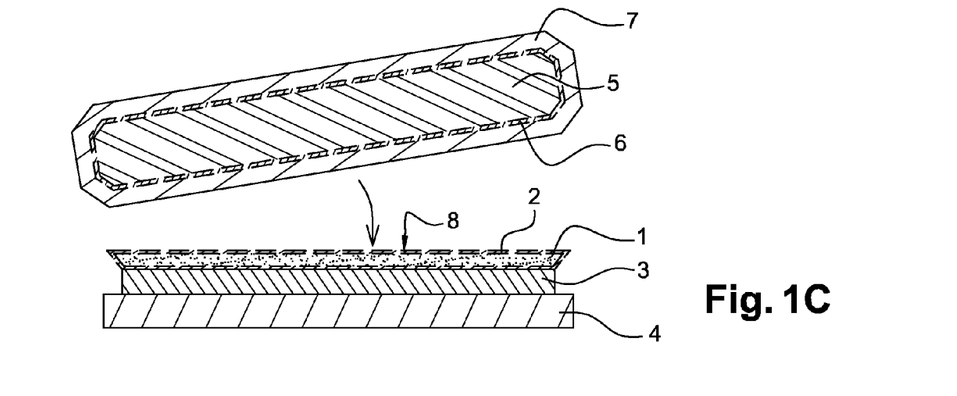
Figure 1D:
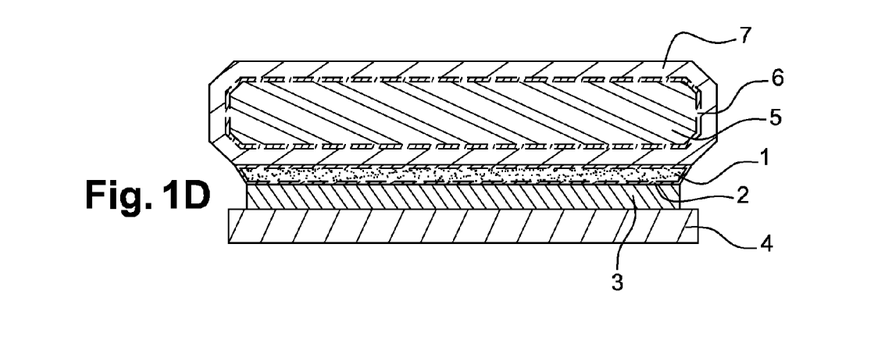

With reference to FIG. 1C, a silicon intermediate substrate 5 coated with a native oxide layer 6 and a deposited silicon oxide layer 7 is bonded by direct hydrophilic bonding on the front face 8 of the silicon layer 1. The front face 8 of the silicon layer 1 and the intermediate substrate 5 were prepared beforehand for the bonding. The silicon layer 1 is planarized by a chemical mechanical polishing such as to achieve a surface roughness lower than 5 angstroms RMS on a field of 5 micrometers×5 micrometers. A chemical cleaning is applied to the layer 1 and the intermediate substrate 5 in silicon. The intermediate substrate 5 and the layer 1 are to this end immersed for 10 minutes in a solution of ozonized water (De-ionized water comprising 20 ppm of dissolved ozone) at 21° C. This first chemical cleaning ensures that the single particles, particularly the hydrocarbon particles present on the surface, are removed. The intermediate substrate 5 and the layer 1 are then rinsed with de-ionized water. Then they are immersed for 10 minutes in an APM solution at 45° C. (Ammoniac hydrogen Peroxide Mixture) which comprises for example a mixture of de-ionized water, ammonia (30%) and hydrogen peroxide (30%) in the proportions of 5:1:1 respectively. This second cleaning makes it possible to finalize the cleaning of the particles of the silicon surface. The solution comprising ammonia is OH⁻ ions rich. These ions will then react with the dangling bonds generated on the silicon surface to form silanol terminations Si—OH which cause a hydrophilization of the surface and promotes direct hydrophilic bonding. The intermediate substrate 5 and the layer 1 are then rinsed with de-ionized water and dried. The intermediate substrate 5 in silicon coated with a clean oxide layer 7 and having Si—OH terminations is then contacted with the front face 8 of the silicon layer 1 coated with a native oxide layer 2 for a direct hydrophilic bonding such as illustrated in FIG. 1D.

A thermal treatment or bonding annealing is then performed at 200° C. for 2 hours in order to reinforce the intermediate bonding energy Ei. Indeed, this thermal treatment promotes the formation of hydrogen bonds between the Si—OH terminations and covalent bonds Si—O—Si at the interface between the layer 1 and the intermediate substrate 5.

According to another possible embodiment of the invention, not illustrated, the intermediate substrate 5 in silicon coated with a native oxide layer 6 and a deposited silicon oxide layer 7 is bonded by anodic bonding on the front face 8 of the silicon layer 1 such as to form siloxane bonds Si—O—Si. The anodic bonding is particularly obtained by contacting surfaces 7, 8, to bond, a thermal treatment at around 400° C. and an electrical potential difference between the layer 1 and the intermediate substrate 5 in the magnitude of several hundred volts.

Figure 1E:
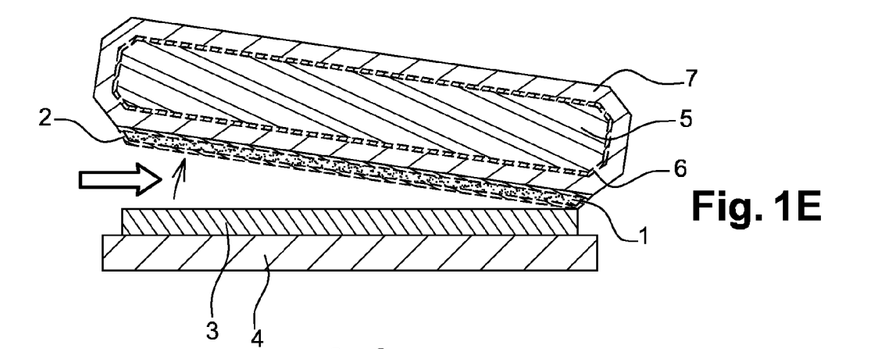

With reference to FIG. 1E, the structure comprising the layer 1 bonded to the intermediate substrate 5 is placed in an anhydrous atmosphere such that the siloxane bonds Si—O—Si are not weakened by interactions with water molecules. In such an environment, the intermediate bonding energy Ei takes the value Ei1 of around 2.5 J/m² which is higher than the binding energy E0 of around 2 J/m² between the layer 1 and the initial substrate 4, whereof the bond will be preferentially broken. Mechanical stress illustrated by the arrow represented on FIG. 1E is thus applied at the interface between the layer 1 and the initial substrate 4 such as to facilitate the detachment of the initial substrate 4.

Figure 1F:
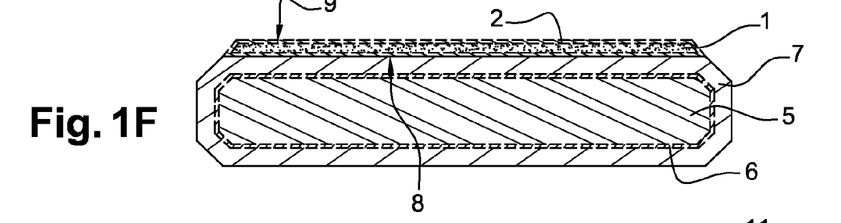

With reference to FIG. 1F, a silicon intermediate substrate 5 bonded to the front face 8 of a silicon layer 1 is obtained such that the rear face 9 of the layer 1 is exposed. It is thus possible to perform one or several technological steps on the rear face 9 of the layer 1, which is mechanically stiffened due to its bonding with the intermediate substrate 5. This functionalization of the rear face 9 of the layer 1 would have been impossible to achieve in the presence of a polymer intermediate substrate 5 which is not resistant to high temperatures and overly aggressive treatments. Preferably, the technological steps do not involve a temperature higher than that used for annealing the bonding such as not to increase the bonding energy Ei by creating other covalent siloxane bonds, unless the applied thermal budget ultimately makes it possible to achieve Ei2<Ef.

Figure 1G:
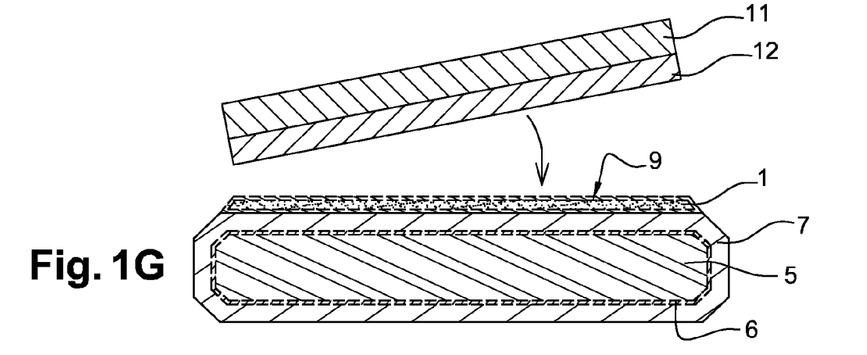

With reference to FIG. 1G, a DVS-bis-BCB film 12 is formed then cross-linked on the surface of a final polyimide substrate 11 such as Kapton®. The film 12 of BIS-DVS-BCB is contacted with the rear face 9 of the functionalized layer 1 in order to obtain the same type of bonding as that of the layer 1 on the initial substrate 4. The final bonding energy Ef is thus similar to the binding energy E0, namely around 2J/m² in this embodiment.

Figure 1H:
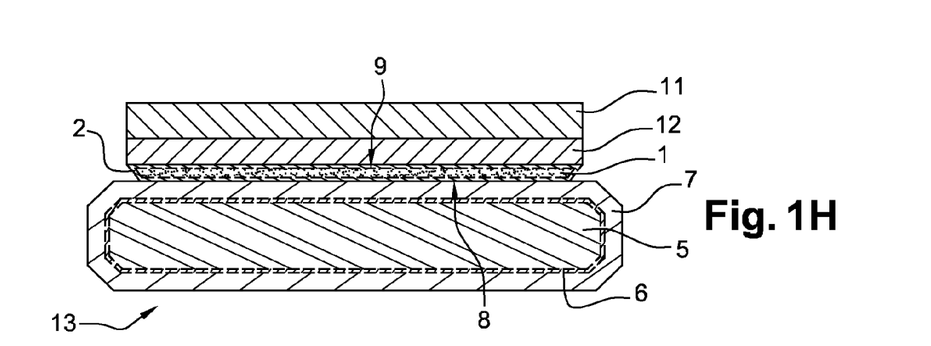

The intermediate structure 13 thus obtained is illustrated in FIG. 1H. The intermediate structure 13 comprises a final substrate 11 in a polymer material 11 bonded to the rear face 9 of a silicon layer 1 via a DVS-BIS-BCB-based adhesive film 12 with an energy Ef, and the front face 8 of the layer 1 is bonded to a silicon intermediate substrate 5 with an energy Ei.

Figure 1I:
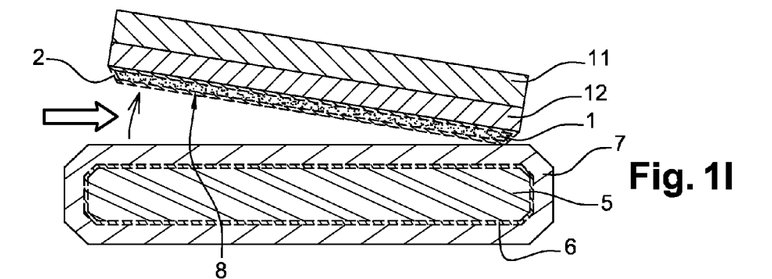

With reference to FIG. 1I the intermediate structure 13 is placed in a wet atmosphere of a clean room comprising around 40% humidity. Under mechanical stress, the covalent bonds Si—O—Si are weakened by the formation of interactions with water molecules. The siloxane bond is corroded and tends to form silanol terminations Si—OH at the surfaces in contact. The intermediate bonding energy Ei thus takes the value Ei2 of around 1J/m², lower than the value of the final bonding energy Ef of around 2J/m² in this embodiment. A blade is then applied at the weakest bonding energy Ei2. The corrosion mechanism of the Si—O—Si bond comes to complete the mechanical debonding mechanism as the blade moves forward between the silicon layer 1 and the intermediate substrate 5.

Figure 1J:
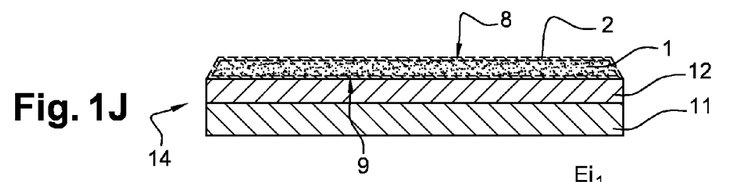

With reference to FIG. 1J, the intermediate substrate 5 has been debonded from the front face 8 of the layer 1. A final structure 14 comprising a silicon layer 1, the rear face 9 of which is bonded to a final polyimide substrate 11 via DVS-BIS-BCB-based film 12, is thus obtained.

Figure 2:
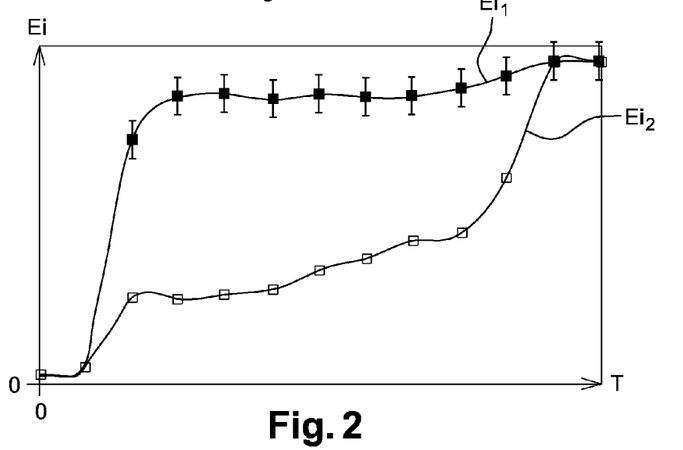
FIG. 2 is a graph illustrating the variation of the intermediate bonding energy Ei, in anhydrous atmosphere and in wet atmosphere, according to the temperature.

FIG. 2 represents a graph illustrating the variation of the energy Ei obtained experimentally from a direct hydrophilic bonding between a silicon layer 1 coated in a native oxide layer 2 and a silicon intermediate substrate 5 coated in a thermal oxide layer 7. The two curves respectively represent the variation of the bonding energy in an anhydrous atmosphere (triangle—Ei1) and in a wet atmosphere (square—Ei2) according to the applied temperature. It appears that below a threshold temperature, the bonding energy is low for the two energies Ei1 and Ei2. In fact, within this temperature range, the layer 1 is mainly bonded to the intermediate substrate 5 by Van Der Waals type interactions. Beyond this threshold temperature, the bonding energy Ei1 and Ei2 increase with a steep slope. This increase can be attributed to the creation of covalent bonds, particularly of Si—O—Si type bonds between the two bonded surfaces. However, it is worth noting that the variation slope of the energy Ei1 is clearly much greater than that of the energy variation Ei2. It is particularly possible to obtain a ratio of the energy Ei1 and the energy Ei2 of a value close to 4. This graph further shows that the method of the invention can advantageously be applied to a wide range of temperatures for which the bonding energy Ei1 is noticeably higher than the energy Ei2.

A second embodiment of the method according to the invention is now described with reference to FIGS. 3A to 3E where the initial binding energy E0 is in this case a holding energy of a porous layer 15. In accordance with FIG. 3A a structure comprising a porous silicon layer 15 is initially obtained by making a surface layer of a silicon substrate porous. The forming of a porous layer is for example carried out by the Eltran method. A monocrystalline silicon layer 1 is then deposited by epitaxy on the porous layer 15. The porous layer 15 of a thickness for example of 0.5 micrometer and a porosity of 80%, is the layer that allows the holding between the silicon layer 1 and the initial silicon substrate 4. Such a porous layer 15 has a binding energy E0 of around 2J/m². A thermal oxide layer 16 is then formed on the front face 8 of the silicon layer 1 by a thermal treatment in a wet environment. If necessary, the layer 1 is planarized by CMP until a roughness of less than 5 angstroms RMS is reached on a field of 5 micrometers×5 micrometers. A silicon intermediate substrate 5 having a native silicon oxide layer 17 is prepared prior to being placed in contact with the front face 8 of the layer 1. This preparation, also carried out on the front face 8 of the layer 1 comprises the steps of cleaning with a solution of SPM at 130° C. (Sulfuric acid and hydrogen Peroxide Mixture) comprising for example a mixture of sulfuric acid (98%) and hydrogen peroxide (30%) in proportions of 3 volumes of acid per 1 volume of hydrogen peroxide, then a solution of APM as mentioned above. The thus, clean and hydrophilic surfaces are put in contact for a direct hydrophilic bonding. Stabilization annealing of this bonding is carried out at 200° C. for 2 hours.

Figure 3A:
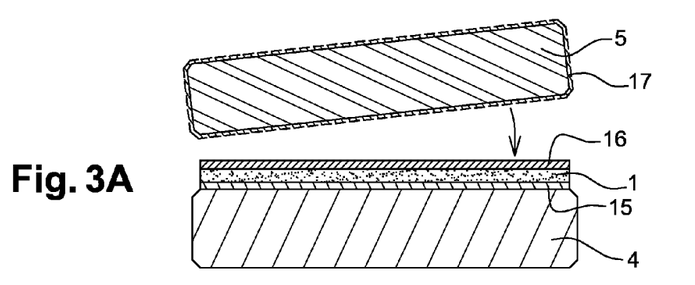
FIGS. 3A and 3E represent steps of a method of transferring a layer of material according to a second embodiment of the invention.
Figure 3B:
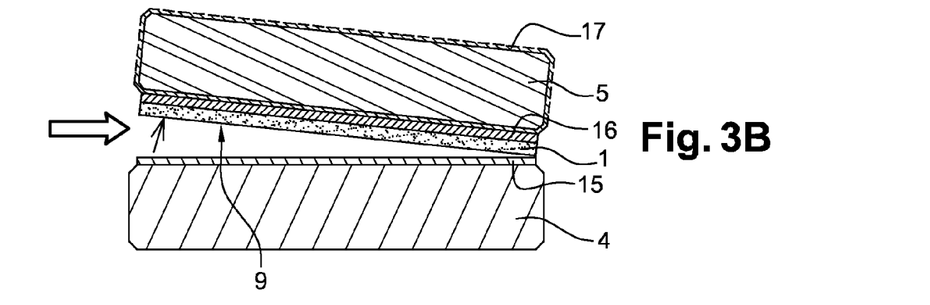

With reference to FIG. 3B, the thus, obtained structure is placed in dry nitrogen which makes it possible to obtain an anhydrous atmosphere comprising less than 1 ppm of water vapor. The hydrophilic bonding thus exhibits intermediate bonding energy Ei1 of a value of around 2.5 J/m² much higher than the binding energy E0 of the porous silicon layer 15 of this embodiment. Then, the application of the jaws, symbolized by the arrow represented in FIG. 3B, allows for the detachment at the weakest energy interface, between the layer 1 and the initial substrate 4.

Figure 3C:
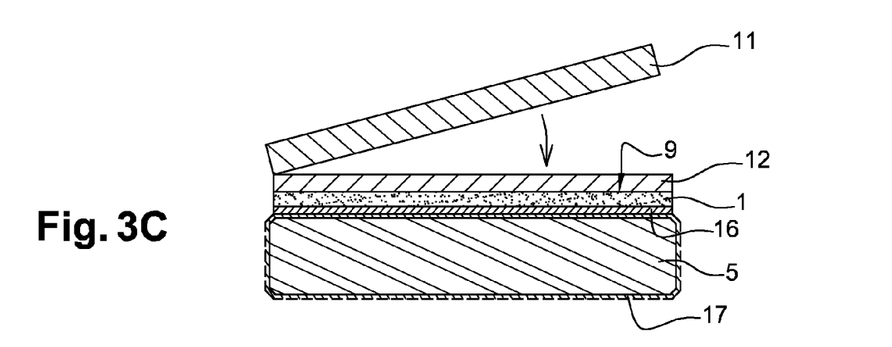

With reference to FIG. 3C, the rear face 9 of the layer 1 transferred onto the intermediate substrate 5 is exposed such that the technological steps such as a CMP, ion etching and/or deposition of layers and/or photolithography can be performed thereto. It is obvious that, as for the aforementioned method, these technological steps should not exceed the thermal budget (temperature and duration) which could reinforce the intermediate bonding and lead to inequality Ef<Ei2 . A final substrate 11 of polyimide type polymer is then bonded to the rear face 9 of the layer 1 via a cross-linked DVS-BIS-BCB film 12 according to the same embodiment as that described above with reference to FIGS. 1A to 1J.

Figure 3D:
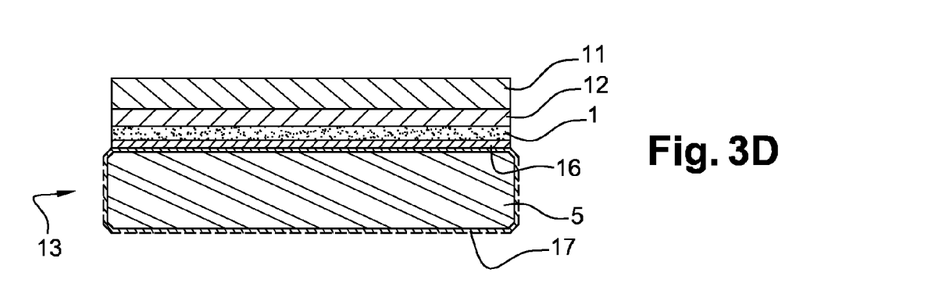

With reference to FIG. 3D, an intermediate structure 13 having a final bonding energy Ef, with a value similar to the initial binding energy E0 of around 2J/m², is then obtained.

Figure 3E:
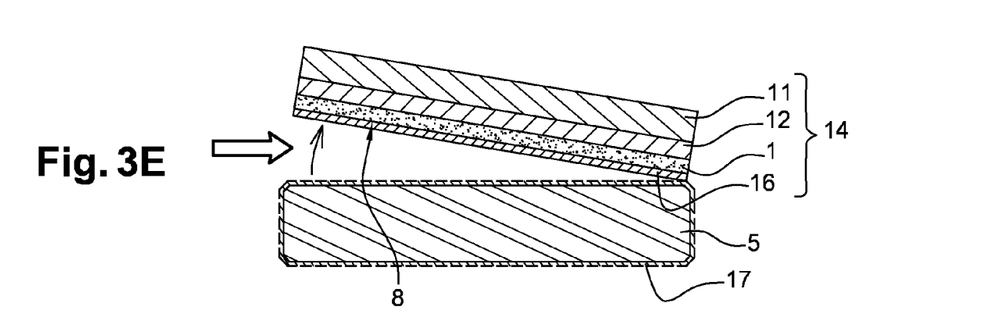

As illustrated in FIG. 3E, the intermediate structure 13 is placed in a wet atmosphere, typically comprising the humidity rate of a clean room (around 40%).

The covalent siloxane Si—O—Si bonds, a source of the high bonding energy between the layer 1 and the intermediate substrate 5, tend to break upon application of a mechanical peel stress (or traction) in the presence of water to form silanol terminations Si—OH, generating a bonding by hydrogen bond, of a lower energy. The intermediate bonding energy takes the value Ei2 by around 1J/m². This technique makes it possible to selectively promote debonding of the layer 1 at the bonding interface with the lowest energy Ei2 . The presence of water at the point of separation increases corrosion of the siloxane bonds which break to form silanol terminations reducing the bonding energy at the same time as mechanical stress progresses to the bonding interface. Once the intermediate substrate 5 is separated from the final structure 14, it is cleaned in order to be recycled in another method.

It is thus possible to obtain a final structure 14 comprising a final substrate 11 in a polymer material whereon is bonded the rear face 9 functionalized with a silicon layer 1 by a selective and simple to implement double layer transfer method. This final structure 14, as well as that obtained by the first aforementioned embodiment can be used for applications in the fields of flexible technologies, flexible electronics such as smart cards, smart textiles, electronics, MEMS, NEMS, high power electronics, RF and microwave, microelectronics, optics, optoelectronics and photovoltaics. The layer 1 transferred and/or the layer(s) possibly deposited at its surface, may advantageously be used as an active layer(s) in devices in these fields. For example, when the final substrate 11 is sufficiently flexible it is possible to achieve strain gauges.

Furthermore, this method also allows the use of two different types of binding between the layer 1 and the initial substrate 4 (porous layer 15) and between the layer 1 and the final substrate 11 (bonding by adhesive).

It is also possible to use the method of the invention with an energy Ef higher than the binding energy E0, in as far as the energy Ef remains lower than the intermediate bonding energy Ei1. This can be obtained, for example according to the first aforementioned embodiment with reference to FIGS. 1A to 1J except that the cross-linking of the DVS-BIS-BCB film 12 on the final substrate 11 is carried out after contacting the layer 1 and the final substrate 11. The thermocompression treatment for bonding the layer 1 with the final substrate 11 may in fact serve to crosslink the DVS-BIS-BCB film 12. The thus, obtained bonding allows for greater adhesion between the surfaces, such that the bonding energy Ef is greater than the energy E0.

Furthermore, the present invention is not limited to one layer 1 and substrates 4, 5 or 11 having the shape of a wafer of a determined diameter. The invention also relates to any other shape type of layer 1 and substrates 4.5 or 11, particularly a layer 1 or parallelepiped substrates 4, 5 or 11 and that could be constituted of several layers.

Thus, the present invention provides a substantial improvement to the prior art by providing a method of transferring a layer 1 which could be carried out easily, which allows for the recycling of substrates 4, 5, the application of technological steps on the rear face 9 of the layer 1 and the forming of a final structure 14 comprising a layer 1 transferred onto a substrate with a wide variety of bonding types.

It goes without saying that the invention is not limited to the embodiments described above by way of examples but includes all technical equivalents and the alternatives of the described means as well as their combinations.

The invention claimed is:

1. A method of transferring a layer , composed in particular of a semi-conductor, insulating or metallic material, the method comprising:
   a) providing a layer joined to an initial substrate (4) with a binding energy E0 between the layer and the initial substrate ;
   b) bonding a front face of the layer on an intermediate substrate according to an intermediate bonding energy Ei;
   c) detaching the initial substrate from the layer to expose a rear face of the layer ;
   e) bonding a rear face onto a final substrate according to a final bonding energy Ef, and
   f) debonding the intermediate substrate from the layer to transfer the layer onto the final substrate ;
   step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef.

2. The method of transferring a layer according to claim 1, wherein step b) comprises a step of carrying out a direct hydrophilic bonding.

3. The method of transferring a layer according to claim 1, wherein step b) comprises a step of carrying out an anodic bonding.

4. The method of transferring a layer according to claim 1, wherein the method comprises a step of forming a silicon layer or an oxide layer selected from among native SiO2, thermal SiO2, deposited SiO2, SiOx and SixOyNz, respectively on the front face of the layer and on the intermediate substrate and in that step b) comprises a step of contacting the formed layers with each other such as to obtain the formation of siloxane bonds Si—O—Si.

5. The method of transferring a layer according to claim 1, wherein the first anhydrous atmosphere has a water vapor content lower than 1 ppm.

6. The method of transferring a layer according to claim 1, wherein the second wet atmosphere has a humidity content ranging between 20% and 80%.

7. The method of transferring a layer according to claim 1, wherein the detachment of step c) and/or the debonding of step f) comprises the simultaneous application of a mechanical stress, such as the use of jaws, the application of a blade or a wedge respectively, between the layer and the initial substrate, and between the intermediate substrate and layer.

8. The method of transferring a layer according to claim 1, wherein it comprises a technological step d) which is carried out between steps c) and e), and which is applied to the rear face of the layer, the thermal budget of the technological step having a value lower than a threshold value beyond which Ei2>Ef.

9. The method of transferring a layer according to claim 1, wherein step e) comprises a bonding step carried out via an adhesive film such as a DiVinylSiloxane-bis-BenzoCycloButene (DVS-bis-BCB), polyimide or a photosensitive polymer film.

10. The method of transferring a layer according to claim 1, wherein step e) comprises a molecular adhesion bonding step such that the final bonding energy has a value Ef independent from the humidity rate of the second atmosphere.

11. The method of transferring a layer according to claim 1, wherein the binding energy E0 between the layer and the initial substrate is obtained by forming a porous layer on which the layer is deposited.

12. The method of transferring a layer according to claim 1, wherein the layer comprises a monocrystalline silicon material and the intermediate substrate comprises a silicon material.

13. The method of transferring a layer according to claim 1, wherein the layer comprises a material composed of at least one of silicon and germanium, a material of elements of the group II-VI and a binary, ternary or quaternary material of elements from the group III-V.

14. The method of transferring a layer according to claim 1, wherein the material of the initial substrate and the material of the final substrate comprise a material comprising at least one of sapphire, silicon, germanium, silica, glass, quartz, a material of elements from the group II-VI, a binary, ternary or quaternary material of elements from the group III-V such as AsGa, InP or GaN, a metal, a metal alloy and a polymer, for example a polyimide such as Kapton®.

15. A method of transferring a layer, composed in particular of a semi-conductor, insulating or metallic material, the method comprising
 a) providing a layer joined to an initial substrate (4) with a binding energy E0 between the layer and the initial substrate;
 b) bonding a front face of the layer on an intermediate substrate according to an intermediate bonding energy Ei;
 c) detaching the initial substrate from the layer to expose a rear face of the layer;
 e) bonding a rear face onto a final substrate according to a final bonding energy Ef, further including a bonding step carried out via an adhesive film such as a DiVinylSiloxane-bis-BenzoCycloButene (DVS-bis-BCB), polyimide or a photosensitive polymer film;
 f) debonding the intermediate substrate from the layer to transfer the layer onto the final substrate;
 step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef; and
 further including a technological step d) carried out between steps c) and e), and which is applied to the rear face of the layer, the thermal budget of the technological step having a value lower than a threshold value beyond which Ei2>Ef.

16. A method of transferring a layer, composed in particular of a semi-conductor, insulating or metallic material, the method comprising:
 a) providing a layer joined to an initial substrate (4) with a binding energy E0 between the layer and the initial substrate;
 b) bonding a front face of the layer on an intermediate substrate according to an intermediate bonding energy Ei;
 c) detaching the initial substrate from the layer to expose a rear face of the layer;
 e) bonding a rear face onto a final substrate according to a final bonding energy Ef, further including a molecular adhesion bonding step such that the final bonding energy has a value Ef independent from the humidity rate of the second atmosphere;
 f) debonding the intermediate substrate from the layer to transfer the layer onto the final substrate;
 step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef; and
 further including a technological step d) carried out between steps c) and e), and which is applied to the rear face of the layer, the thermal budget of the technological step having a value lower than a threshold value beyond which Ei2>Ef.

17. A method of transferring a layer, composed in particular of a semi-conductor, insulating or metallic material, the method comprising:
 a) providing a layer joined to an initial substrate with a binding energy E0 between the layer and the initial substrate, wherein the binding energy E0 between the layer and the initial substrate is obtained by forming a porous layer on which the layer is deposited;
 b) bonding a front face of the layer on an intermediate substrate according to an intermediate bonding energy Ei;
 c) detaching the initial substrate from the layer to expose a rear face of the layer ;
 e) bonding a rear face onto a final substrate according to a final bonding energy Ef;
 f) debonding the intermediate substrate from the layer to transfer the layer onto the final substrate;
 step b) comprising a step of forming siloxane bonds Si—O—Si, step c) being carried out in a first anhydrous atmosphere and step f) being carried out in a second wet atmosphere such that the intermediate bonding energy Ei takes a first value Ei1 in step c) and a second value Ei2 in step f), with Ei1>E0 and Ei2<Ef; and
 further including a technological step d) which is carried out between steps c) and e), and which is applied to the rear face of the layer, the thermal budget of the technological step having a value lower than a threshold value beyond which Ei2>Ef.

* * * * *